(12) United States Patent
Yang et al.

(10) Patent No.: US 9,166,084 B2
(45) Date of Patent: Oct. 20, 2015

(54) INTERBAND CASCADE (IC) PHOTOVOLTAIC (PV) ARCHITECTURE FOR PV DEVICES

(75) Inventors: Rui Q. Yang, Norman, OK (US); Zhaobing Tian, Norman, OK (US); Tetsuya D. Mishima, Norman, OK (US); Michael B. Santos, Norman, OK (US); Matthew B. Johnson, Norman, OK (US); John F. Klem, Albuquerque, NM (US)

(73) Assignee: Board of Regents University of Oklahoma, Norman, OK (US)

( * ) Notice: Subject to any disclaimer, the term of this patent is extended or adjusted under 35 U.S.C. 154(b) by 824 days.

(21) Appl. No.: 13/024,203

(22) Filed: Feb. 9, 2011

(65) Prior Publication Data

US 2012/0199185 A1     Aug. 9, 2012

(51) Int. Cl.
*H01L 31/0725* (2012.01)
*H01L 31/0735* (2012.01)
*H01L 31/0352* (2006.01)
*B82Y 20/00* (2011.01)

(52) U.S. Cl.
CPC ......... *H01L 31/035236* (2013.01); *B82Y 20/00* (2013.01); *H01L 31/0725* (2013.01); *H01L 31/0735* (2013.01); *Y02E 10/544* (2013.01)

(58) Field of Classification Search
CPC .......... H01L 31/0735; H01L 31/035236; H01S 5/3401; H01S 5/3416; H01S 5/3422
USPC .......... 136/252, 255, 260, 262, 264
See application file for complete search history.

(56) References Cited

U.S. PATENT DOCUMENTS

| | | | |
|---|---|---|---|
| 5,588,015 A | 12/1996 | Yang | |
| 5,799,026 A | 8/1998 | Meyer et al. | |
| 6,404,791 B1 | 6/2002 | Yang | |
| 6,743,974 B2 * | 6/2004 | Wada et al. | 136/255 |
| 7,202,411 B1 * | 4/2007 | Wernsman | 136/255 |
| 7,282,777 B1 * | 10/2007 | Chuang et al. | 257/431 |
| 2005/0155641 A1 * | 7/2005 | Fafard | 136/249 |
| 2005/0247339 A1 * | 11/2005 | Barnham et al. | 136/262 |

OTHER PUBLICATIONS

Choi, et al., "High-performance GaInAsSb Thermophotovoltaic Devices With an AlGaAsSb Window", Applied Physics Letters, vol. 71, No. 26, Dec. 29, 1997, pp. 3758-3760.

(Continued)

*Primary Examiner* — Jonathan Johnson
*Assistant Examiner* — Andrew Golden
(74) *Attorney, Agent, or Firm* — Conley Rose, P.C.; Grant Rodolph; Jonathan K. Polk

(57) ABSTRACT

A photovoltaic (PV) device, comprising a PV interband cascade (IC) stage, wherein the IC PV stage comprises an absorption region with a band gap, the absorption region configured to absorb photons, an intraband transport region configured to act as a hole barrier, and an interband tunneling region configured to act as an electron barrier. An IC PV architecture for a photovoltaic device, the IC PV architecture comprising an absorption region, an intraband transport region coupled to the absorption region, and an interband tunneling region coupled to the intraband transport region and to the adjacent absorption region, wherein the absorption region, the intraband transport region, and the interband tunneling region are positioned such that electrons will flow from the absorption region to the intraband transport region to the interband tunneling region.

22 Claims, 8 Drawing Sheets

(56) References Cited

OTHER PUBLICATIONS

Green, et al., "Solar Cell Efficiency Tables (Version 34)," Progress in Photovoltaics: Research and Applications, 2009, vol. 17, pp. 320-326.

Harder, et al., "Theoretical Limits of Thermophotovoltaic Solar Energy Conversion," Semiconductor Science and Technology, vol. 18, 2003, pp. S151-S157.

Henry, "Limiting Efficiencies of Ideal Single and Multiple Energy Gap Terrestrial Solar Cells," Journal of Applied Physics, vol. 51, No. 8, Aug. 1980, pp. 4494-4500.

King, et al., "40% Efficient Metamorphic GaInP/GaInAs/Ge Multifunction Solar Cells," Applied Physics Letters, vol. 90, 2007, pp. 183516-1-183516-3.

Kurtz, et al., "A Comparison of Theoretical Efficiencies of Multi-junction Concentrator Solar Cells," Progress in Photovoltaics: Research and Applications, vol. 16, Apr. 2008, pp. 537-546.

Razeghi, et al., "Recent Advances in LWIR Type-II InAs/GaSb Superlattice Photodetectors and Focal Plane Arrays at the Center for Quantum Devices, Improvement in material quality and structural for Long Wave Infrared devices have increased their capability for use in imaging application," Proceedings of the IEEE, vol. 97, No. 6, Jun. 2009, pp. 1056-1066.

Tian, et al., "Plasmon-Waveguide Interband Cascade Lasers Near 7.5 μm," IEEE Photonics Technology Letters, vol. 21, No. 21, pp. 1588-1590.

Yang, "Novel Concepts and Structures for Infrared Lasers," Chapter 2, "Long Wavelength Infrared Emitters Based on Quantum Wells and Superlattices," edited by Manfred Helm, Gordon & Breach Pub., Singapore, 2000, pp. 13-64.

Yang, et al., "Distributed Feedback Mid-IR Interband Cascade Lasers at Thermoelectric Cooler Temperatures," IEEE Journal of Selected Topics in Quantum Electronics, vol. 13, No. 5, Sep./Oct. 2007, pp. 1074-1078.

Yang, et al., "Interband Cascade Infrared Photodetectors With Superlattice Absorbers," Journal of Applied Physics, vol. 107, 2010, pp. 054514-1-054514-6.

Yang, et al., "Interband Cascade Photovoltaic Devices," Applied Physics Letters, vol. 96, No. 6, 2010, pp. 063504-1-063504-3.

\* cited by examiner

US 9,166,084 B2

INTERBAND CASCADE (IC) PHOTOVOLTAIC (PV) ARCHITECTURE FOR PV DEVICES

STATEMENT REGARDING FEDERALLY SPONSORED RESEARCH OR DEVELOPMENT

This invention was made with government support under Contract Number ECCS0838439 awarded by the National Science Foundation, Contract Number DMR0520550 awarded by the National Science Foundation, Contract Number FA9550-09-1-0288 awarded by the Air Force Office of Scientific Research, and Contract Number DE-AC04-94AL85000 awarded by the U.S. Department of Energy's National Nuclear Security Administration. The government has certain rights in the invention.

CROSS-REFERENCE TO RELATED APPLICATIONS

Not applicable.

REFERENCE TO A MICROFICHE APPENDIX

Not applicable.

BACKGROUND

Photovoltaic (PV) devices, such as solar cells, are important for the conversion of solar and thermal energy into electricity. Conventional PV devices are based on semiconductor p-n junctions. For a single-junction cell with one band-gap (at a concentration of one sun), the maximum theoretical conversion efficiency is about 30%, and a current state-of-the-art efficiency of about 28% at higher concentrations (i.e. >500 suns). To achieve high conversion efficiency, multiple junction cells with different band-gap materials can be used. For example, triple-junction solar cells (containing materials with three different energy gaps) have a theoretical conversion efficiency of 56% at 1,000 suns, and a current state-of-the-art efficiency of about 32% at 1 sun and approximately 41% at 240 suns. One of the obstacles that affect practical PV device performance is a limitation in the availability of semiconductor materials with a range of bandgaps that adequately span the solar (or heat) spectrum and that can be effectively integrated within a single device or system, as well as current matching between multiple junctions.

SUMMARY

In one embodiment, the disclosure includes a PV device, comprising an interband cascade (IC) PV stage, wherein the IC PV stage comprises an absorption region with a band gap, the absorption region configured to absorb photons, an intraband transport region configured to act as a hole barrier, and an interband tunneling region configured to act as an electron barrier.

In another embodiment, the disclosure includes an IC PV architecture for a photovoltaic device, the IC PV architecture comprising an absorption region, an intraband transport region coupled to the absorption region, and an interband tunneling region coupled to the intraband transport region, wherein the absorption region, the intraband transport region, and the interband tunneling region are positioned such that electrons will flow from the absorption region to the intraband transport region to the interband tunneling region.

In yet another embodiment, the disclosure includes a method for performing IC PV device operations, comprising absorbing photons with an absorption region having a band gap, operating an intraband transport region as a hole barrier, and operating an interband tunneling region as an electron barrier.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Disclosed herein is a interband cascade (IC) photovoltaic (PV) architecture for PV devices. Examples of PV devices that may benefit from the disclosed IC PV architecture include, but are not limited to, solar cells, solar panels, and thermophotovoltaic devices. In at least some embodiments, the disclosed IC PV architecture comprises absorption and transport regions with characteristics that are favorable for achieving high open-circuit voltage, and thus improving conversion efficiency over conventional PV devices. Preliminary experiments carried out using IC infrared photodetectors and lasers, showed open-circuit voltages that exceed the single band-gap voltage from these devices under infrared light illumination. Although the observed open-circuit voltage was based on multiple IC PV architecture stages operating in series, the disclosed embodiments are not intended to limit other arrangements for the IC PV architecture stages.

Figure 1:
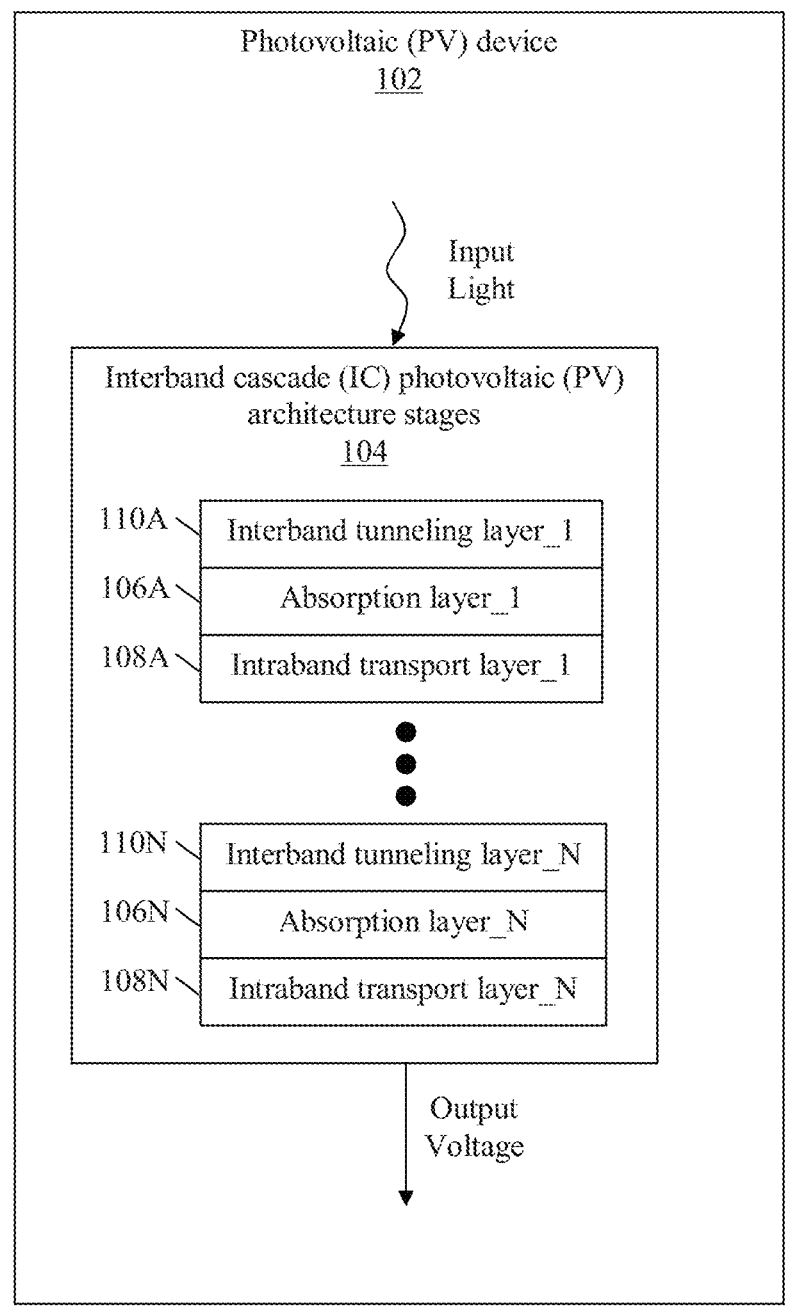
FIG. 1 shows a PV device in accordance with an embodiment of the disclosure.

FIG. 1 shows an embodiment of a photovoltaic device 102 in accordance with an embodiment of the disclosure. As shown, the photovoltaic device 102 comprises IC PV architecture stages 104, where each stage comprises an interband tunneling region (i.e., each of layers 110A-110N corresponds to an interband transport tunneling region), an absorption region (i.e., each of layers 106A-106N corresponds to an absorption region) that operates to absorb photons, and an intraband transport region (i.e., each of layers 108A-108N corresponds to an intraband transport region).

Each absorption region 106A-106N may correspond to the same band gap or to different band gaps. Absorption regions with the same band gap could be implemented, for example, to enable high intensity photon beams of a particular energy level to be absorbed. Meanwhile, absorption regions 106A-106N with different band gaps could be implemented to enable photons with different energy levels to be absorbed. As an example, if the photovoltaic device 102 corresponds to a solar cell or solar panel, the absorption regions 106A-106N may provide a variety of band gaps to account for photons with different energy levels being emitted from the sun. Alternatively, if the photovoltaic device 102 corresponds to a thermophotovoltaic device, the absorption regions 106A-106N may provide a plurality of similar band gaps to account for photons with the same energy levels being emitted from a local source of light/heat.

In at least some embodiments, the layers forming IC PV architecture stages 104 (N stages are shown) are stacked in series. In alternative embodiments, the IC PV architecture stages 104 may be arranged into multiple side-by-side stacks that are electrically connected in series.

Figure 2A:
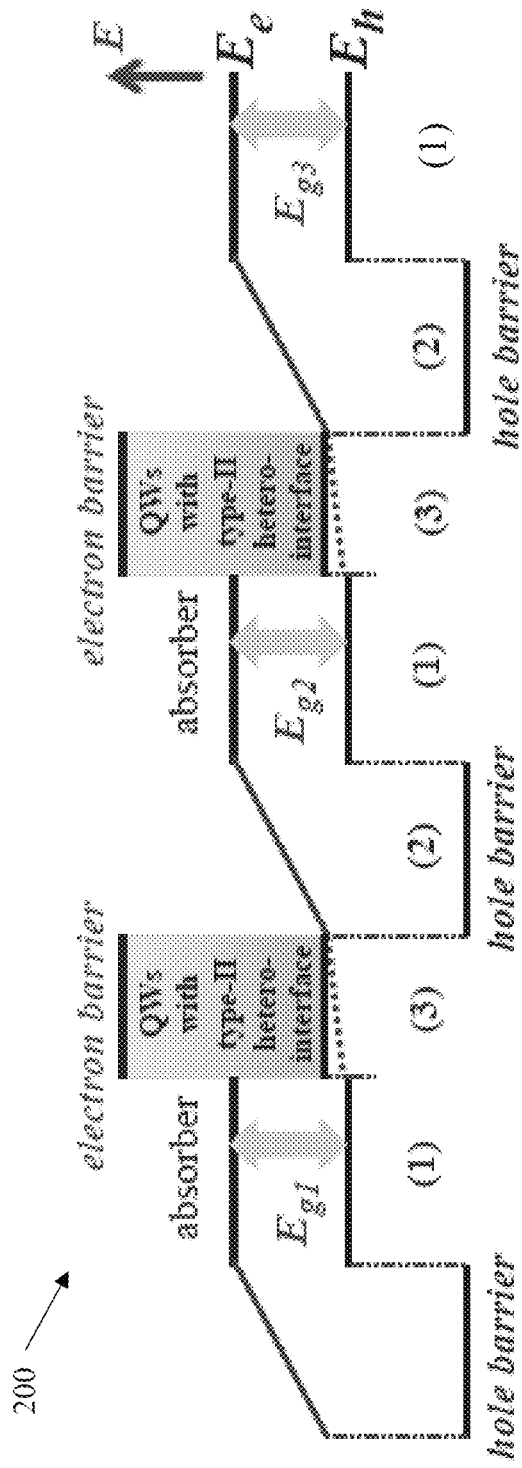
FIG. 2A shows of an embodiment of an interband cascade (IC) photovoltaic (PV) architecture for photovoltaic devices in accordance with an embodiment of the disclosure.

FIG. 2A shows of an embodiment of an IC PV architecture 200 for photovoltaic devices in accordance with an embodiment of the disclosure. The disclosed IC PV architecture 200 may comprise multiple cascade stages where each stage is divided into three regions according to three processes: (1) photon absorption, (2) intraband carrier transport, and (3) interband tunneling transport, as shown in FIG. 2A. In at least some embodiments, the absorption regions (1) for IC PV architecture 200 comprises a type-II quantum well (QW) or superlattice (SL) structure connected by asymmetric intraband transport regions (2) and interband tunneling regions (3) with a type-II heterointerface for facilitating interband tunneling. Regions (2) and (3) also act as hole and electron barriers, respectively. The effective bandgap in each absorption region (1) (corresponding to bandgap energies $E_{g1}$ to $E_{g3}$) is determined by the layer thicknesses in the SL and can be tailored to cover a wide spectral range. The bandgap and thickness of the absorber in a cascade stage can be designed to be either the same or different from the adjacent stages, depending on the photon distribution of the radiation source. For the different bandgaps, photon absorption may cause electrons to be excited from a valence state $E_h$ to a conduction state $E_e$.

Stages with the same and different effective band gaps can be stacked in a way analogous to the different p-n junctions in a multiple-junction cell to more efficiently make use of the source spectrum. As discussed below, it is possible to stack many such stages with different band gaps to efficiently divide up a source spectrum. The transport regions (2) are constructed, for example, with compositionally-graded semiconductor alloys or with digitally-graded multiple QWs to form a tilted-band profile. This construction enables the conduction band of one end of the profile to be near the conduction band of the adjoining absorption region, while the conduction band at the other end of the profile is near the valence band of the absorption region adjoining it. The transport region (2) plays a role similar to the depletion region in a conventional p-n junction to direct current in one direction. However, only the electrons move through the intraband transport region because holes are confined in regions (1) and (3).

Figure 2B:
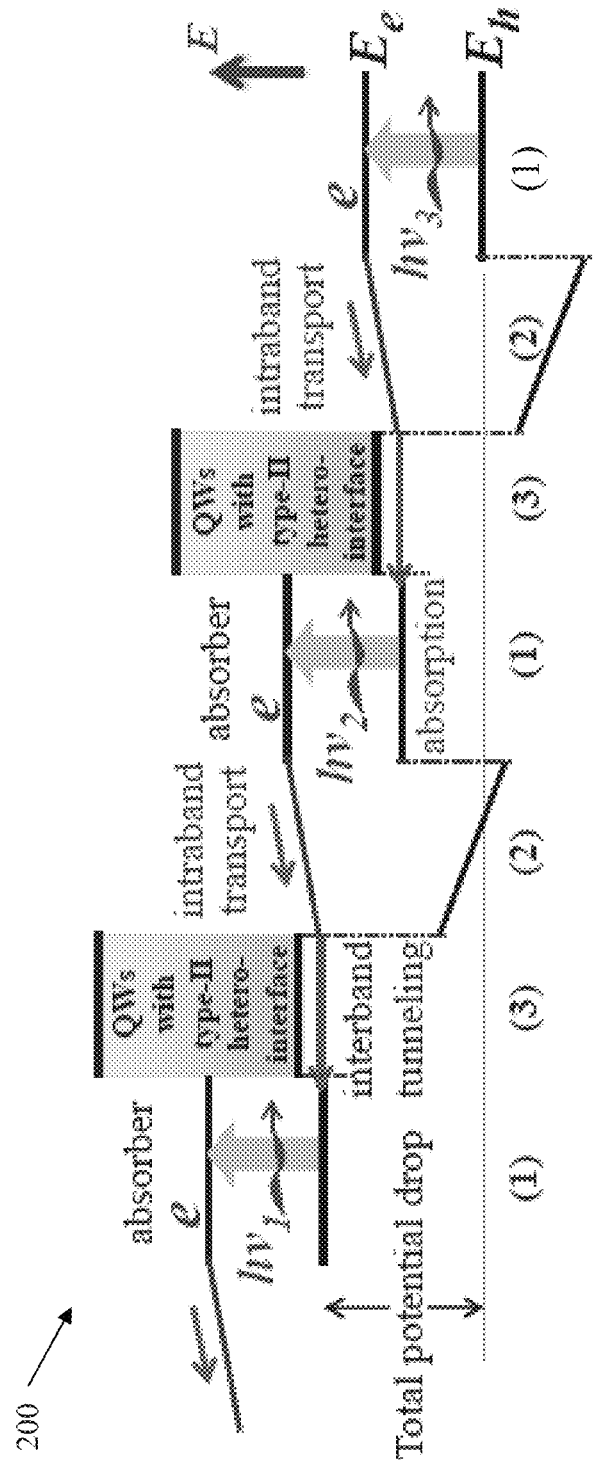
FIG. 2B shows the IC PV architecture of FIG. 2A during illumination.

When light is incident upon the IC PV architecture 200, photogeneration of electrons and holes results in a separation of electron and hole quasi-Fermi levels. FIG. 2B shows the IC PV architecture 200 of FIG. 2A during illumination. As shown in FIG. 2B, electrons move to the left (with holes moving to the right) due to the asymmetry of the transport region. At steady state, an internal electric field will be built up to balance this movement of charge carriers, resulting in a sequential potential drop in each cascade stage, shown in FIG. 2B. These potential drops in every stage add and contribute to a total forward bias voltage similar to that in a multiple p-n junction cell. However, in contrast to the p-n junction structure, where heavily-doped p- and n- regions are required, doping is not necessary in the IC PV architecture 200 structures, eliminating the detrimental effects of high carrier concentrations such as free-carrier absorption and reduced minority-carrier diffusion length. This IC PV architecture 200 is particularly desirable for high-intensity illumination with a concentrator, where the high-intensity radiation may not be fully absorbed in the single p-n junction of a conventional cell whose thickness is limited to the photogenerated carrier diffusion length. For a PV device with the IC PV architecture 200, multiple stages with the same energy gap can be used to absorb all the photons in a particular portion of the source spectrum while increasing the open-circuit voltage, where the thickness of each stage is shorter than the diffusion length and is chosen so that each stage generates the same photocurrent (the stages are current matched). Losses associated with high-current operation are also minimized by increasing the open circuit voltage.

Figure 3:
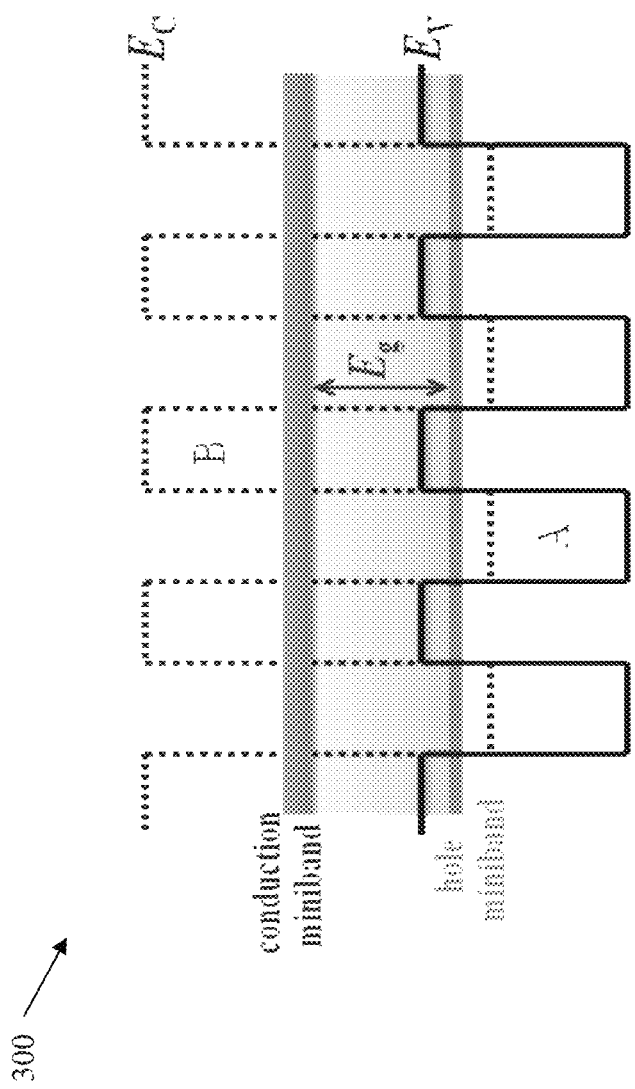
FIG. 3 shows an absorption region structure for an IC PV architecture in accordance with an embodiment of the disclosure.

FIG. 3 shows an absorption region structure 300 for an IC PV architecture (e.g., corresponds to absorption regions (1) of IC architecture 200) in accordance with an embodiment of the disclosure. In at least some embodiments, the absorption region structure 300 is constructed of semiconductor materials A and B that have a type-II band-edge alignment (preferably of the broken-gap variety, i.e., with the conduction-band edge, $E_C$, of material A lower in energy than the valence-band edge, $E_V$, of material B) to form QW or SL structures, as shown in FIG. 3. Because of quantum size effects, the locations of energy minibands in the SL are mainly determined by the thicknesses of the layers of materials A and B. As such, the bandgap $E_g$ (the energy separation between the first conduction miniband and the first hole miniband) in the SL is not determined solely by the bandgaps of the constituent materials A and B, but can be tailored to cover a wide spectral range with great flexibility by adjusting layer thicknesses. Therefore, a photovoltaic device consisting of type-II QW or SL absorption regions can be quantum engineered to optimize the absorption of photons over the entire spectrum of a radiation source. The use of the SL absorption regions versus conventional p-n junction cells have several advantages. For example, each of the absorption regions is made from the same constituent materials, which makes it: 1) simpler to grow by molecular beam epitaxy (MBE); 2) simpler to adjust the absorption wavelengths to optimize the slicing of the incident photon flux vs. energy spectrum; and 3) simpler to add more absorption regions. Further, dark current may be reduced in an IC structure where radiation and absorption (even at the same photon energy) is partitioned by multiple cascade stages, and the thickness of each stage is significantly shorter than the diffusion length and comparable to (or shorter than) the wavelength of corresponding photons. And finally, the interband tunneling regions (3) with type-II heterostructures will be less resistive than Esaki tunnel p-n junctions used in conventional tandem cells, and the high-voltage, low-current characteristic of the multi-stage arrangement will serve to minimize the losses associated with residual parasitic device resistances.

Figure 4:
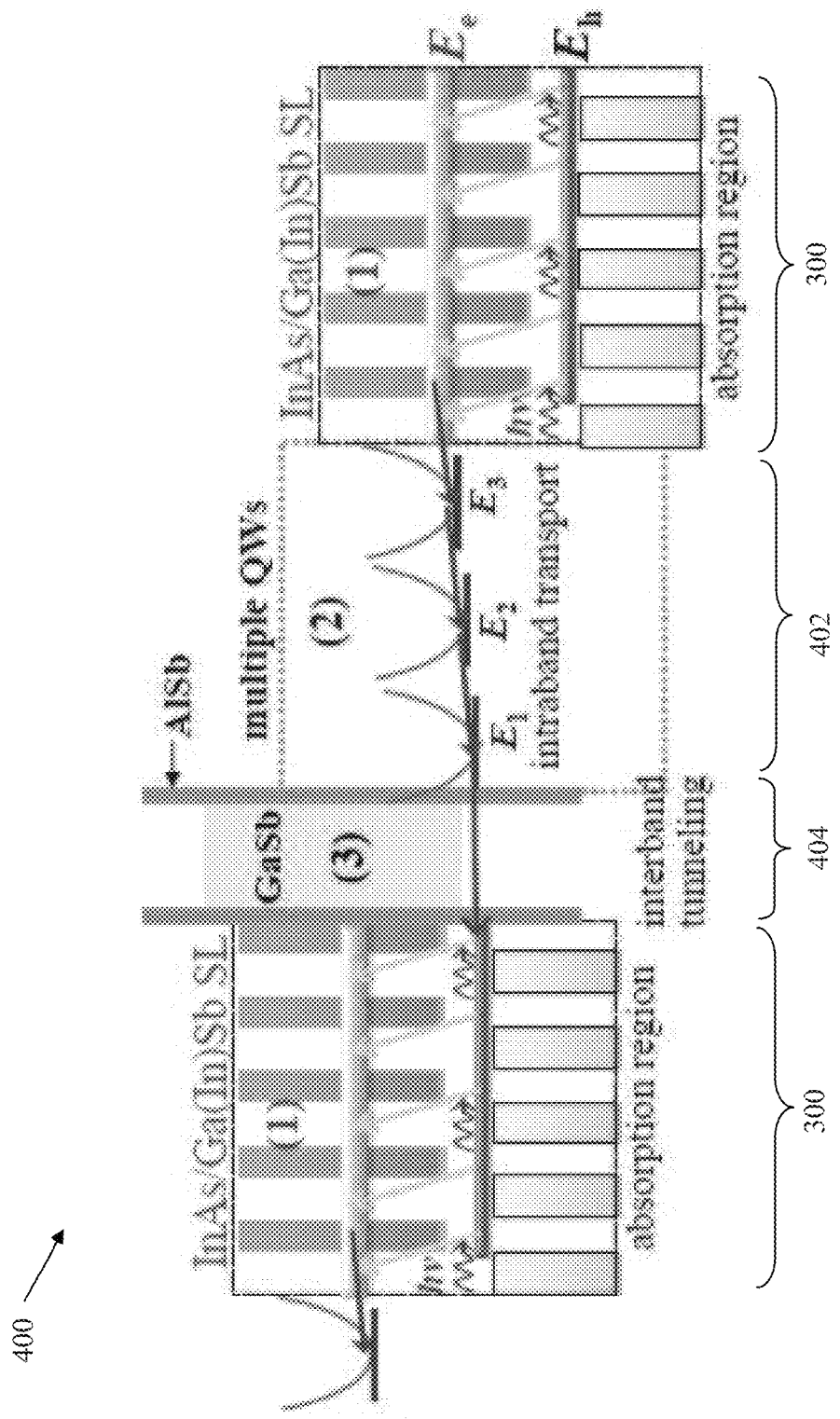
FIG. 4 shows operations of an IC PV architecture with the absorption region structure of FIG. 3 in accordance with an embodiment of the disclosure.

FIG. 4 shows operations of an IC PV architecture 400 with the absorption region structure 300 of FIG. 3 in accordance with an embodiment of the disclosure. In at least some embodiments, IC PV architecture 400 can be constructed with readily available semiconductor materials. In embodiments, the absorption region may comprise one or more semiconductor layers consisting of or comprising Indium-Arsenic (InAs), Indium-Arsenic-Antimony (InAsSb), Indium-Gallium-Arsenic (InGaAs), Indium-Gallium-Arsenic-Antimony (InGaAsSb), Gallium-Antimony (GaSb), Gallium-Indium-Antimony (GaInSb), Aluminum-Gallium-Antimony (AlGaSb), Aluminum-Gallium-Indium-Antimony (AlGaInSb), Gallium-Arsenic (GaAs), Aluminum-Antimony (AlSb), Aluminum-Arsenic (AlAs), Aluminum-Indium-Antimony (AlInSb), Aluminum-Antimony-Arsenic (AlSbAs), Aluminum-Gallium-Antimony-Arsenic (AlGaSbAs), Aluminum-Indium-Gallium-Antimony-Arsenic (AlInGaSbAs), or combinations thereof. Similarly, the intraband transport region may comprise one or more semiconductor layers consisting of or comprising InAs, InAsSb, InGaAs, InGaAsSb, GaSb, GaInSb, AlGaSb, AlGaInSb, GaAs, AlSb, AlAs, AlInSb, AlSbAs, AlGaSbAs, AlInGaSbAs, or combinations thereof. Additionally, the interband tunneling region may comprise one or more semiconductor layers consisting of or comprising InAs, InAsSb, InGaAs, InGaAsSb, GaSb, GaInSb, AlGaSb, AlGaInSb, GaAs, AlSb, AlAs, AlInSb, AlSbAs, AlGaSbAs, AlInGaSbAs, or combinations thereof.

For example, the IC PV architecture 400 may be constructed from materials such as InAs/GaSb/AlSb materials. In the IC PV architecture 400, the transport region 402 comprises multiple QWs with energy levels $E_1$, $E_2$, $E_3$, etc., (only three levels are shown to simplify the diagram) to form an energy ladder for directing and facilitating electron transport to the left. The transport of electrons to the right is greatly suppressed because the electron level $E_e$ is located in the bandgap of the interband tunneling region (electron barrier) 404, which comprises, for example, GaSb and AlSb layers. This bandgap blocking and overall asymmetric band profile arrangement will minimize the dark current to the right and benefit photovoltaic operations through maximized electrical power output. When the IC PV architecture 400 is illuminated, electrons move through the three operations shown in FIG. 4. These operations are: (1) excitation of electrons by photons to the conduction state $E_e$; (2) intraband transport via miniband $E_e$ and sequential energy levels ($E_1$, $E_2$, ...) to the left; and (3) interband tunneling facilitated by the type-II band edge alignment. The energy levels ($E_1$, $E_2$, ...) in the transport region 402 become nearly aligned to form an effective intraband transport channel for electrons when illuminated. This is similar to an IC laser structure under a forward bias, but in the IC PV architecture 400 the current is reversed with net photon absorption instead of photon emission.

In at least some embodiments of the IC PV architecture 400, the materials for the absorption regions 300 and transport region 402 are type-II aligned III-V materials near lattice parameter 6.1 Å—InAs/GaSb/AlSb with some layers of GaInSb and Aluminum-Arsenic-Antimony (AlAsSb). In such case, InAs and GaSb substrates are appropriate, but GaSb, which has a lattice constant nearly half-way between InAs (0.62% tensile strain) and AlSb (0.65% compressive strain), is preferable (though not required), so that defect-induced generation/recombination will be negligible. These materials have been used to make high-performance light-emitting diodes, lasers, and photodetectors over a wide portion of the infrared (IR) spectrum (2-15 μm). Similarly, Antimony (Sb)-based IC structures have been used for efficient mid-infrared (IR) lasers from 2.7 to 7.5 μm. Hence, IC PV architecture 400 can be expected to exhibit high performance at these wavelengths. For IC PV architecture 400, operation at wavelengths shorter than 2 μm, the electron energy level ($E_e$ in FIG. 3) will need to be pushed near or above the conduction band edge of GaSb to obtain the required larger energy gap. As a consequence, the role of the GaSb layers to block electron transport (to the right in FIG. 4) will be diminished. To alleviate this problem, multiple QW layers may be used in the transport region 402, such that there is a mini-gap (acting as a Bragg reflector for electron waves) aligned with $E_e$ to effectively prevent electrons from direct escape to the right. Also, adequate doping density and distribution can be introduced in the absorption region 300 to direct and enhance electron transport in the desired direction (here, to the left).

Using these techniques, a Sb-based IC PV architecture can be quantum engineered with high conversion efficiency at wavelengths down to about 1.1 μm. An IC PV architecture of this type can be effectively used as the long-wavelength component of a solar cell, or as the sole conversion element in a thermophotovoltaic (TPV) system with a source temperature of 2,000° C. or less. A TPV system could use concentrated solar radiation to heat an intermediate emitter to a temperature significantly lower than the sun's temperature with emission spectrum that is ideally matched to the PV device. Such an IC PV architecture may achieve an overall conversion efficiency above 50% based on a theoretical limit of 85% for a TPV device.

To examine the potential performance of the disclosed IC PV architecture, an IC architecture active in the mid-IR spectrum was tested, with the goal being to show appreciable photo-current and voltage. The first IC PV architecture was designed as an IC photodetector to detect photons at about 5 μm (at 80 K), and the second IC PV architecture was designed as an IC-laser, which lases near 7.5 μm at 80 K. The photodetector structure, grown by MBE, has 7 identical cascade stages, and each stage has a 0.15-μm-thick absorption region that is composed of 28 periods of InAs/GaSb (9 mL/9 mL) SL. These SL absorption regions are separated by a 5.8-nm-thick GaSb QW and the intraband transport region that is composed of InAs/AlSb/AlInSb QWs similar to the injection region in IC lasers. The laser structure, also grown by MBE, has 11 identical cascade stages and each stage has an approximate 20 nm-thick active region.

In alternative embodiments of IC PV architecture 400, the interband tunneling region 404 may have a type-II heterointerface with the intraband transport region of an adjacent IC PV stage. Furthermore, in alternative embodiments, the absorption region 300 comprises one or more semiconductor layers selected from the group consisting of MgSe, HgTe, CdSe, CdTe, ZnTe, CdS, ZeSe, MnSe, MnTe, MgSe, MgTe, and their ternary/quaternary alloys. Furthermore, in alternative embodiments, the intraband transport region 402 comprises one or more semiconductor layers selected from the group consisting of MgSe, HgTe, CdSe, CdTe, ZnTe, CdS, ZeSe, MnSe, MnTe, MgSe, MgTe, and their ternary/quaternary alloys. Furthermore, in alternative embodiments, the interband tunneling region 404 comprises one or more semiconductor layers selected from the group consisting of MgSe, HgTe, CdSe, CdTe, ZnTe, CdS, ZeSe, MnSe, MnTe, MgSe, MgTe, and their ternary/quaternary alloys. Furthermore, in alternative embodiments, at least one IC PV stage is combined with one or more conventional p-n junctions with interband cascade stages.

Furthermore, in alternative embodiments, the IC PV architecture 400 is grown on a substrate selected from group of materials consisting of Ge, Si, GaAs, InP, ZnS, SiC, ZnO, and sapphire.

Figure 5:
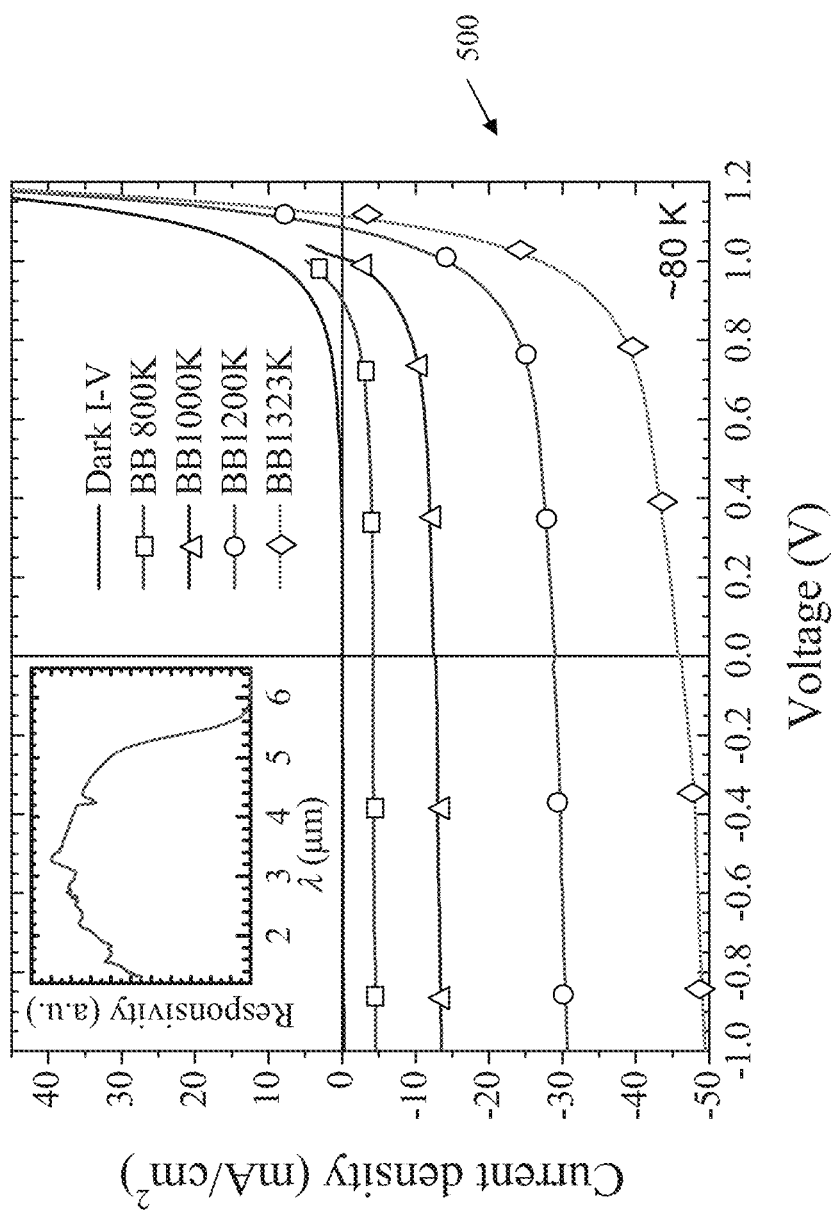
FIG. 5 shows a chart of current density-voltage (J-V) characteristics for an embodiment of an IC PV unit.

FIG. 5 shows a chart 500 of current density-voltage (J-V) characteristics for an embodiment of an IC PV unit. More specifically, chart 500 shows current density-voltage (J-V) characteristics of a deep-etched 0.24-mm-diameter detector device at 80 K in the dark and under illumination from a blackbody (BB) at several temperatures. Besides the observation of significant photocurrent (up to 45 mA/cm$^2$ at zero bias under illumination of the BB at 1,323K), the open-circuit voltage attained is about 1.11 V, which is several times higher than the single band-gap value of 0.24 V, as determined by the cut-off wavelength (~5.2 μm) of the photocurrent response spectrum (FIG. 5 inset). A shallow-etched 0.24-mm-diameter device shod an open-circuit voltage of 1.17 V, which is about 70% of the equivalent band-gap voltage of total 7 cascade stages (i.e. the sum of 7 single band-gap voltage values).

Figure 6:
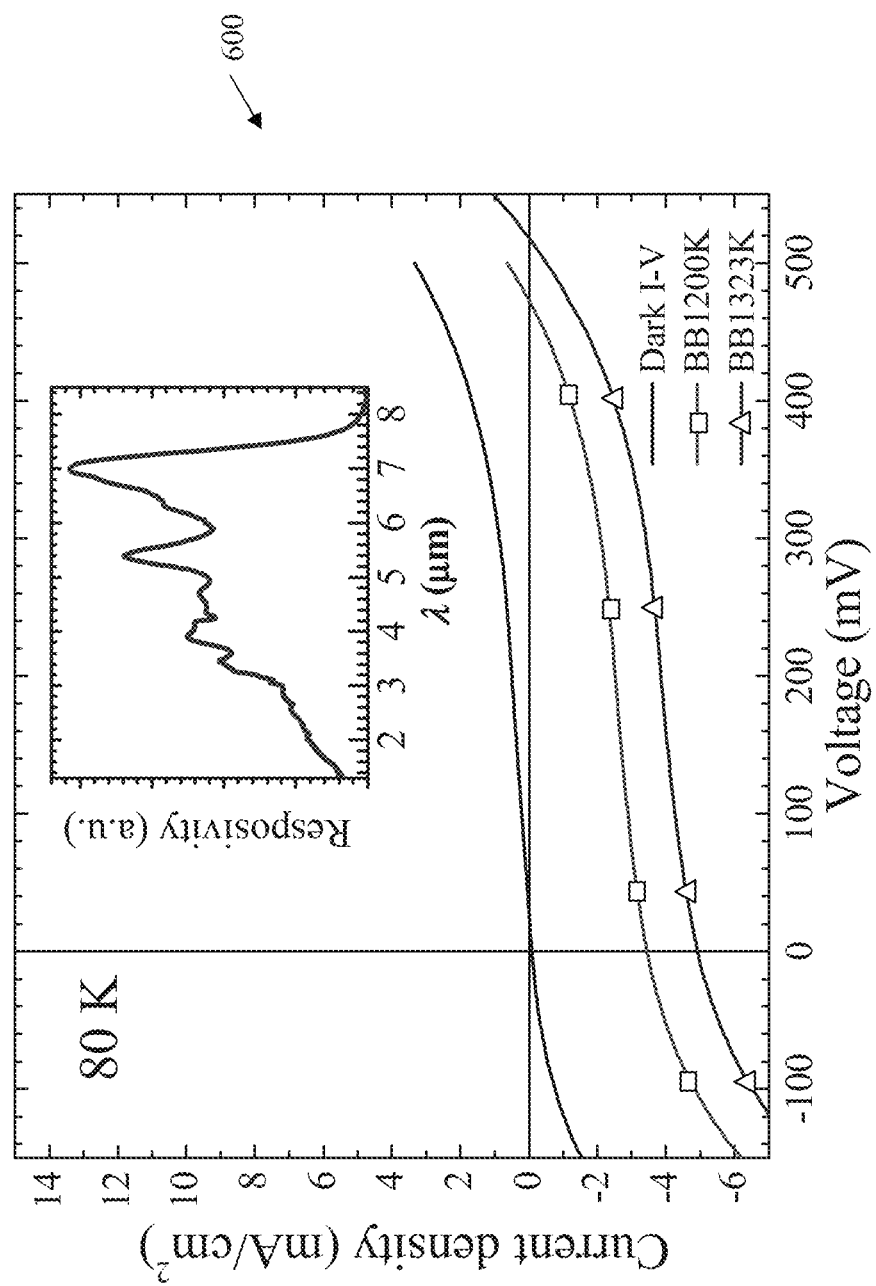
FIG. 6 shows a chart of current density-voltage (J-V) characteristics for another embodiment of an IC PV unit.

FIG. 6 shows a chart 600 of current density-voltage (J-V) characteristics for another embodiment of an IC PV unit. More specifically, the chart 600 shows current density-voltage (J-V) characteristics of a broad-area (150 μm×2.7 mm) IC laser device at 80 K in the dark and under illumination from a blackbody (BB) at several temperatures. These laser structures show photocurrent and open-circuit voltage. The photocurrent density is significantly less than that for the detector device due to the use of thinner absorber layers associated with the simple set of QWs in the IC lasers. The open-circuit voltage is as high as 0.52 V, which significantly exceeds the single band-gap voltage of 0.17 V, as determined by the cutoff wavelength (~7.2 μm) of the photocurrent response spectrum (FIG. 6 inset). In this case, the open-circuit voltage of 0.52 is about 30% of the equivalent band-gap voltage of the total 11 cascade stages. This is much less than the 70% value above, again because the absorber layers in the laser devices are much thinner and the dark current is more significant at longer wavelengths.

Figure 7:
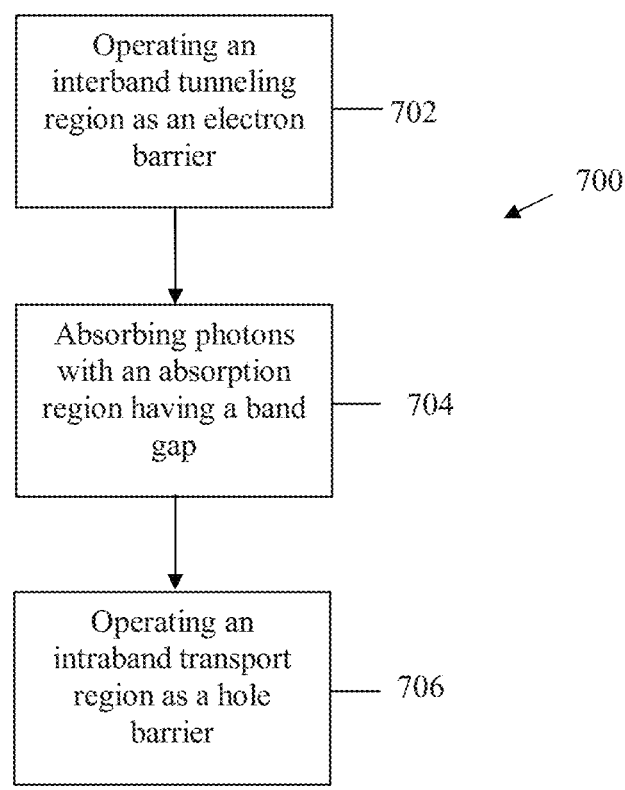
FIG. 7 shows a method for IC PV device operations in accordance with an embodiment of the disclosure.

FIG. 7 shows a method 700 for IC PV device operations in accordance with an embodiment of the disclosure. As shown, the method 700 comprises operating an interband tunneling region as an electron barrier (block 702). The method also comprises absorbing photons with an absorption region having a band gap (block 704). The method 700 also comprises operating an intraband transport region as a hole barrier (block 706).

In at least some embodiments, the method 700 may comprise additional steps or fewer steps. As an example, the method 700 may additionally comprise performing the absorbing step and the operating steps for each of a plurality of IC PV stages. Further, the method 700 may additionally comprise absorbing photons with different absorption regions configured to absorb photons with different energy levels. Further, the method 700 may additionally comprise absorbing photons with different absorption regions configured to absorb photons with substantially similar energy levels. Further, the method 700 may additionally comprise stacking each of a plurality of IC PV stages in series.

To summarize, a new IC PV architecture and corresponding PV devices are disclosed. Examples of the effectiveness of the IC PV architecture (using IC photodetector and laser structures) are also disclosed. Even though these tested devices were not designed as PV devices to be operated in forward bias, a significant photocurrent and high open-circuit voltage was achieved. The high open-circuit voltage demonstrates the potential of the cascade concept, which will also work with different stages designed to absorb different regions of the source spectrum. The testing was performed at 80 K without limitation. Room temperature operation would also be possible at short-wave to mid-IR wavelengths.

In at least some embodiments, the PV devices with the disclosed IC PV architecture comprises type-II hetero structures to facilitate interband tunneling between serially connected light absorption units that have different band gaps. As such, transport is smooth without heavy-doped p-n junctions, and the conversion efficiency can be higher than single-unit photovoltaic cells because multiple absorption units can convert optical energy from various photons (with different wavelength) into electrical energy. Also, the disclosed IC PV architecture explores a new transport mechanism. Instead of relying on conventional p-n junctions, photon-excited carriers can form the current via intersubband relaxations between neighboring quantum wells, which may improve overall efficiency. These features can be incorporated into a IC PV architecture for a PV device independently or in combination, depending on applications and specific requirements.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A photovoltaic (PV) device, comprising:
   at least one PV interband cascade (IC PV) stage having a conduction band and a valence band, comprising:
   an absorption region with a band gap, the absorption region configured to absorb photons;
   an intraband transport region configured to act as a hole barrier and coupled to the absorption region, wherein the intraband transport region has a band gap that is greater than the band gap of the absorption region; and
   an interband tunneling region configured to act as an electron barrier and coupled to the absorption region, wherein the interband tunneling region has a band gap that is greater than the band gap of the absorption region,
   wherein the absorption region is positioned between the intraband transport region and the interband tunneling region,
   wherein the interband tunneling region is configured such that:
   electrons in the conduction band will flow from the absorption region to the intraband transport region, in a direction away from the interband tunneling region;
   electron flow in an opposite direction is suppressed by the interband tunneling region; and
   holes in the valence band will flow from the absorption region toward the interband tunneling region, and
   wherein the PV device is configured to operate at a forward bias voltage with a net photon absorption for generating an electric output.

2. The photovoltaic device of claim 1 comprising a plurality of the IC PV stages.

3. The photovoltaic device of claim 1, comprising a plurality of the IC PV stages, wherein at least some of the plurality of IC PV stages are stacked in series.

4. The photovoltaic device of claim 1, wherein the photovoltaic device is a solar panel.

5. The photovoltaic device of claim 1, wherein the photovoltaic device is a thermophotovoltaic device.

6. The photovoltaic device of claim 1, comprising a plurality of the IC PV stages., wherein absorption regions corresponding to different IC PV stages of the plurality of IC PV stages are configured to absorb photons with different energies.

7. The photovoltaic device of claim 1, comprising a plurality of the IC PV stages, wherein absorption regions corresponding to different IC PV stages of the plurality of IC PV stages are configured to absorb photons with substantially similar energies.

8. The photovoltaic device of claim 1, wherein the absorption region of the at least one IC PV stage comprises type-II quantum wells or a type-II superlattice.

9. The photovoltaic device of claim 1, wherein the absorption region of the at least one IC PV stage comprises one or more semiconductor layers selected from the group consisting of InAs, InAsSb, InGaAs, InGaAsSb, GaSb, GaInSb, AlGaSb, AlGaInSb, GaAs, AlSb, AlAs, AlInSb, AlSbAs, AlGaSbAs, and AlInGaSbAs.

10. The photovoltaic device of claim 1, wherein the intraband transport region of the at least one IC PV stage comprises one or more semiconductor layers selected from the group consisting of InAs, InAsSb, InGaAs, InGaAsSb, GaSb, GaInSb, AlGaSb, AlGaInSb, GaAs, AlSb, AlAs, AlInSb, AlSbAs, AlGaSbAs, and AlInGaSbAs.

11. The photovoltaic device of claim 1, comprising a plurality of the IC PV stages, wherein the interband tunneling region of the at least one IC PV stage is coupled via a type-II heterointerface with an intraband transport region of an adjacent IC PV stage.

12. The photovoltaic device of claim 1, wherein the interband tunneling region of the at least one IC PV stage comprises one or more semiconductor layers selected from the group consisting of InAs, InAsSb, InGaAs, InGaAsSb, GaSb, GaInSb, AlGaSb, AlGaInSb, GaAs, AlSb, AlAs, AlInSb, AlSbAs, AlGaSbAs, and AlInGaSbAs.

13. The photovoltaic device of claim 1, wherein the at least one IC PV stage is grown on a substrate selected from the group consisting of InAs, InP, GaAs, GaSb, and Si.

14. The photovoltaic device of claim 1, wherein the absorption region comprises one or more semiconductor layers selected from the group consisting of MgSe, HgTe, CdSe, CdTe, ZnTe, CdS, ZeSe, MnSe, MnTe, MgSe, MgTe, and their ternary/quaternary alloys.

15. The photovoltaic device of claim 1, wherein the intraband transport region comprises one or more semiconductor layers selected from the group consisting of MgSe, HgTe, CdSe, CdTe, ZnTe, CdS, ZeSe, MnSe, MnTe, MgSe, MgTe, and their ternary/quaternary alloys.

16. The photovoltaic device of claim 1, wherein the interband tunneling region comprises one or more semiconductor layers selected from the group consisting of MgSe, HgTe, CdSe, CdTe, ZnTe, CdS, ZeSe, MnSe, MnTe, MgSe, MgTe, and their ternary/quaternary alloys.

17. The photovoltaic device of claim 1, wherein the at least one IC PV stage is combined with one or more conventional p-n junctions with interband cascade stages.

18. The photovoltaic device of claim 1, wherein the PV device is grown on a substrate selected from the group of materials consisting of Ge, Si, GaAs, InP, ZnS, SiC, ZnO, and sapphire.

19. The photovoltaic device of claim 1, wherein the thickness of the at least one IC PV stage is shorter than the carrier diffusion length.

20. The photovoltaic device of claim 1, comprising a plurality of the IC PV stages, wherein the plurality of IC PV stages are configured to be current matched, and wherein electrons in the conduction band that flow from the absorption region to the intraband transport region then flow into a valence band of an interband tunneling region of an adjacent IC PV stage.

21. The photovoltaic device of claim 1, comprising a plurality of the IC PV stages, wherein absorption regions corresponding to different IC PV stages of the plurality of IC PV stages are configured to absorb photons with different wavelengths.

22. A photovoltaic (PV) device, comprising:
- at least one PV interband cascade (IC PV) stage having a conduction band and a valence band, comprising:
  - an absorption region with a band gap, the absorption region configured to absorb photons;
  - an intraband transport region configured to act as a hole barrier and coupled to the absorption region, wherein the intraband transport region has a band gap that is greater than the band gap of the absorption region; and
  - an interband tunneling region configured to act as an electron barrier and coupled to the absorption region, wherein the interband tunneling region has a band gap that is greater than the band gap of the absorption region,
- wherein the absorption region is positioned between the intraband transport region and the interband tunneling region,
- wherein the interband tunneling region is configured such that:
  - electrons in the conduction band will flow from the absorption region to the intraband transport region, in a direction away from the interband tunneling region;
  - electron flow in an opposite direction is suppressed by the interband tunneling region; and
  - electrons in the conduction band that flow from the absorption region to the intraband transport region then flow into a valence band of an interband tunneling region of an adjacent IC PV stage, and
- wherein the PV device is configured to operate at a forward bias voltage with a net photon absorption for generating an electric output.

* * * * *